United States Patent
Zhang et al.

(10) Patent No.: US 10,659,067 B2
(45) Date of Patent: May 19, 2020

(54) ALKALI-METAL VAPOR CELL ATOMIC CLOCK SYSTEM

(71) Applicant: Tsinghua University, Beijing (CN)

(72) Inventors: Jian-Wei Zhang, Beijing (CN); Xiao-Lin Sun, Beijing (CN); Peng-Fei Cheng, Beijing (CN); Ya-Ni Zuo, Beijing (CN); Li-Jun Wang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 16/505,589

(22) Filed: Jul. 8, 2019

(65) Prior Publication Data

US 2019/0334537 A1    Oct. 31, 2019

Related U.S. Application Data

(63) Continuation of application No. PCT/CN2017/114483, filed on Dec. 4, 2017.

(30) Foreign Application Priority Data

Jan. 10, 2017 (CN) .......................... 2017 1 0015477

(51) Int. Cl.
*H03L 7/26* (2006.01)
*G04F 5/14* (2006.01)
*H03B 17/00* (2006.01)

(52) U.S. Cl.
CPC .............. *H03L 7/26* (2013.01); *G04F 5/145* (2013.01); *H03B 17/00* (2013.01)

(58) Field of Classification Search
CPC ... G04F 5/145; G04F 5/14; H03L 7/26; H03B 17/00
See application file for complete search history.

(56) References Cited

U.S. PATENT DOCUMENTS 6,919,770 B2 * 7/2005 Happer .................... G04F 5/14
                                                                        331/3
9,954,544 B2 * 4/2018 Goka ........................ H03L 7/26
(Continued)

FOREIGN PATENT DOCUMENTS

CN        103454902        12/2013
CN        105811972         7/2016
(Continued)

OTHER PUBLICATIONS

Danet, Jean-Marie, et al. "Dick effect in a pulsed atomic clock using coherent population trapping." IEEE Transactions on Ultrasonics, Ferroelectrics, and Frequency Control 61.4 (2014): 567-574. (Year: 2014).*

(Continued)

*Primary Examiner* — Ryan Johnson

(57) ABSTRACT

An alkali-metal vapor cell atomic clock system, including a first atomic vapor cell and a second atomic vapor cell. A digital signal processor outputs a first time sequence to control a first laser signal, and the digital signal processor outputs a second time sequence to control a second laser signal. Thereby, the first atomic vapor cell and the second atomic vapor cell can alternately lock a crystal oscillator. A Dick effect is reduced by alternately locking the crystal oscillator, which enables the alkali-metal vapor cell atomic clock system to have more stable frequency output. Because the crystal oscillator has low costs, the alkali-metal vapor cell atomic clock system has advantages of low costs and high stability.

13 Claims, 6 Drawing Sheets

(56) References Cited

U.S. PATENT DOCUMENTS

2007/0076776 A1* 4/2007 Lust .................. H03L 7/26
                                                    372/56
2019/0245315 A1* 8/2019 Goka ................ H03L 7/099

FOREIGN PATENT DOCUMENTS

CN          105991133        6/2017
WO     WO2014034955          3/2014

OTHER PUBLICATIONS

International Search Report of PCT/CN2017/114483.

* cited by examiner

ALKALI-METAL VAPOR CELL ATOMIC CLOCK SYSTEM

CROSS-REFERENCE TO RELATED APPLICATIONS

This application claims all benefits accruing under 35 U.S.C. § 119 from China Patent Application No. 201710015477.0, filed on Jan. 10, 2017 in the State Intellectual Property Office of China, the content of which is hereby incorporated by reference. This application is a continuation under 35 U.S.C. § 120 of international patent application PCT/CN2017/114483 filed on Dec. 4, 2017, the content of which is also hereby incorporated by reference.

FIELD

The present application relates to the technical field of frequency metrology, and in particular, to an alkali-metal vapor cell atomic clock system.

BACKGROUND

The development of atomic clocks with high performance, compact structure, and low power consumption is of great importance to many scientific research and industrial production. Applications of atomic clocks comprise gravitational wave detection, verification of general relativity, new-generation satellite navigation and positioning, network synchronization, and time keeping systems on mobile platforms. In many types of atomic clocks, the alkali-metal vapor cell atomic clock has attracted more and more attention because of its simple structure and high stability. In recent years, with the development of technologies such as laser devices, the laboratory-use alkali-metal vapor cell atomic clocks based on technologies such as optical-microwave double resonance (OMDR), coherence population trapping (CPT), pulsed optical pumping (POP) and pulsed integrating sphere, have achieved the short-term stability of a level of $1-4 \times 10^{-13} \tau^{-1/2}$. Comparing with the present commercial lamp-pumped rubidium atomic clock, the laboratory-use alkali-metal vapor cell atomic clocks have improved the short-term stability by about two orders, and the short-term stability keeps approaching that of a hydrogen maser.

The main factors limiting the short-term stability of the above-mentioned alkali-metal vapor cell atomic clocks include the quantum projection noise, the relative intensity noise of the laser, frequency modulation to amplitude modulation conversion noise, and the Dick effect due to the noise of the crystal oscillator. As early as 1990, G. J. Dick discovered the Dick effect. However, as a magnitude of the Dick effect is small, it was not the main restriction factor for the short-term stability of the atomic clock at that time. However, along with the application of the pulsed Ramsey coherence population trapping (Ramsey-CPT) atomic clock, the short-term stability of the atomic clock gradually approaches the limit of the quantum projection noise, and the Dick effect has then gradually become an important factor restricting the short-term stability of the alkali-metal vapor cell atomic clock.

In order to reduce the Dick effect of the atomic clock, an oscillator with better phase noise properties (such as a cryogenic sapphire oscillator) can be used instead of the ordinary crystal oscillator. However, the above-mentioned oscillator with better phase noise properties is complicated in structure and expensive, which will cause the alkali-metal vapor cell atomic clock with the above oscillator to have a large size and high costs.

SUMMARY

What is needed, therefore, is to provide an alkali-metal vapor cell atomic clock system, which has small size and low costs, and is capable of reducing the Dick effect.

An alkali-metal vapor cell atomic clock system can comprise a crystal oscillator, a frequency synthesizer connected with the crystal oscillator, a proportional-integral-derivative controller connected with the crystal oscillator, and a laser generating device, wherein a frequency signal emitted by the crystal oscillator is converted into a microwave signal by the frequency synthesizer, and the microwave signal is input into the laser generating device, to modulate a laser beam emitted by the laser generating device.

The alkali-metal vapor cell atomic clock system can further comprise a first atomic vapor cell and a second atomic vapor cell, wherein the laser beam emitted by the laser generating device is divided into a first laser signal entering the first atomic vapor cell and a second laser signal entering the second atomic vapor cell, and the first atomic vapor cell and the second atomic vapor cell are both alkali-metal atomic vapor cells.

The alkali-metal vapor cell atomic clock system can further comprise a digital signal processor connected with the laser generating device and the proportional-integral-derivative controller respectively, wherein the digital signal processor outputs a first time sequence to control the first laser signal, and the digital signal processor outputs a second time sequence to control the second laser signal.

The alkali-metal vapor cell atomic clock system can further comprise a photoelectric sensing device connected with the digital signal processor, wherein the photoelectric sensing device is configured to receive optical signals respectively output from the first atomic vapor cell and the second atomic vapor cell, convert the optical signals into electrical signals, and transmit the electrical signals to the digital signal processor, and the digital signal processor calculates a correction signal according to the electrical signals. The proportional-integral-derivative controller adjusts an output frequency of the crystal oscillator according to the correction signal.

In an embodiment, the laser generating device comprises a laser device, an electro-optical modulator, a spectroscopic means, a first acousto-optic modulator, a second acousto-optic modulator, and a laser time sequence regulator; the microwave signal and the laser beam emitted by the laser device enter the electro-optical modulator in which the laser beam is modulated by the microwave signal; a modulated laser beam is divided, by the spectroscopic means, into the first laser signal and the second laser signal having the same intensity; and the laser time sequence regulator is connected with the digital signal processor.

In an embodiment, the spectroscopic means is a non-polarization beam splitting prism.

In an embodiment, the laser generating device further comprises a half-wave plate disposed between the electro-optical modulator and the laser device.

In an embodiment, the laser time sequence regulator comprises a first radio frequency (RF) switch connected with the first acousto-optic modulator, a second RF switch connected with the second acousto-optic modulator, and a RF source connected with the first RF switch and the second RF switch. The first RF switch and the second RF switch are connected with the digital signal processor.

In an embodiment, the photoelectric sensing device comprises a first photoelectric detector and a second photoelectric detector respectively connected with the digital signal processor. The first photoelectric detector is configured to convert the optical signal output from the first atomic vapor cell into an electrical signal, and the second photoelectric detector is configured to convert the optical signal output from the second atomic vapor cell into another electrical signal.

In an embodiment, the alkali-metal vapor cell atomic clock system further comprises a first magnetic shielding device and a second magnetic shielding device, wherein a first magnetic field coil and a first atomic vapor cell heater are provided inside the first magnetic shielding device. A second magnetic field coil and a second atomic vapor cell heater are provided inside the second magnetic shielding device. The first magnetic shielding device is configured to provide a magnetic shield for the first atomic vapor cell. The second magnetic shielding device is configured to provide another magnetic shield for the second atomic vapor cell.

In an embodiment, the crystal oscillator is a voltage-controlled oscillator.

In an embodiment, a free evolution time of the first time sequence overlaps at least partially a laser pumping time of the second time sequence.

In an embodiment, the first atomic vapor cell and the second atomic vapor cell alternately lock the crystal oscillator. When the first atomic vapor cell is in a free evolution state, the second atomic vapor cell is in a laser pumping state.

In an embodiment, the laser generating device comprises a laser device, two electro-optical modulators, a spectroscopic means, a first acousto-optic modulator, a second acousto-optic modulator, and a laser time sequence regulator. A laser beam emitted by the laser device is first divided into two laser beams with the same intensity by the spectroscopic means, and two laser beams enter two electro-optical modulators respectively. Microwave signals emitted by the frequency synthesizer are input into two electro-optical modulators respectively. In the electro-optical modulators, the microwave signals modulates the laser beams. The modulated two laser beams are a first laser signal and a second laser signal. The first laser signal and the second laser signal have the same intensity, and the laser time sequence regulator is connected with the first acousto-optic modulator, the second acousto-optic modulator, and the digital signal processor, respectively.

In an embodiment, the digital signal processor outputs the first time sequence into the first RF switch, to control a time sequence of the first laser signal. The digital signal processor outputs the second time sequence into the second RF switch, to control a time sequence of the second laser signal.

In an embodiment, a laser pumping time of the first time sequence overlaps partially a free evolution time of the second time sequence.

The alkali-metal vapor cell atomic clock system provided by the present disclosure comprises the first atomic vapor cell and the second atomic vapor cell. The digital signal processor outputs the first time sequence to control the first laser signal, and the digital signal processor outputs the second time sequence to control the second laser signal. Thereby, the first atomic vapor cell and the second atomic vapor cell can alternately lock the crystal oscillator. The Dick effect is reduced by alternately locking the crystal oscillator, thereby enabling the alkali-metal vapor cell atomic clock system to have more stable frequency output. In addition, the crystal oscillator has low costs, therefore the alkali-metal vapor cell atomic clock system has the advantages of low costs and high stability.

DETAILED DESCRIPTION

The present disclosure will be described in detail with reference to the accompanying figures and embodiments. It should be understood that the specific embodiments described herein are merely illustrative of the disclosure, but not intended to limit the present disclosure.

Figure 1:
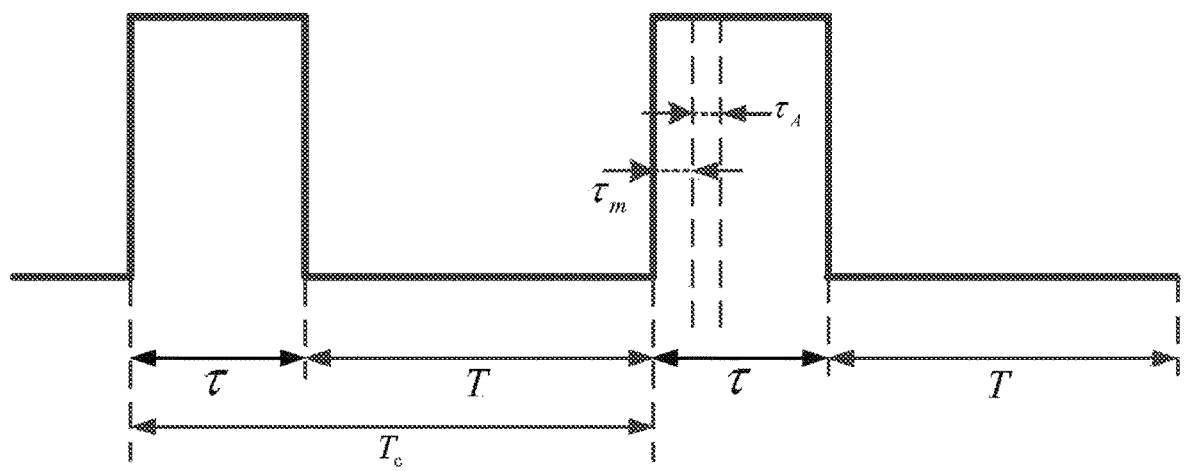
FIG. 1 is a working time sequence diagram of a pulsed coherence population trapping atomic clock.

Referring to FIG. 1, which is a working time sequence diagram of a pulsed coherence population trapping atomic clock, a working process of the pulsed coherence population trapping atomic clock comprises three parts: an optical pumping, a free evolution, and a detection. $\tau$ is an optical pumping time, T is a free evolution time, $\tau_m$ is a detection time, $\tau_A$ is a detection integration time, and Tc is a cycle time. It can be seen from the time sequence diagram of FIG. 1 that only during the free evolution time T can the atom sense the phase change of the local oscillator's output signal, and that the local oscillator's phase is not locked to the atom in the optical pumping time $\tau$ and in the detection integration time $\tau_A$, and this time period is also called the dead time $T_d$. The dead time $T_d$ causes the phase sensitivity function of the pulsed coherence population trapping atomic clock not always to be 1 during one working cycle Tc. Therefore, the spectrum of the phase sensitivity function will be broadened, resulting in a frequency mixing effect caused by the n-th harmonic wave and the local oscillator's phase noise at n/Tc (usually expressed as $S_y^r(m/T_c)$). The feedback loop will regard the mixed signal as an error signal and then feed it back on the local oscillator to optimize the output of the local oscillator, which will deteriorate the short-term stability of the local oscillator. What is described above is the Dick effect in the pulsed coherence population trapping atomic clock and the influence of the Dick effect on the local oscillator's output.

Figure 2:
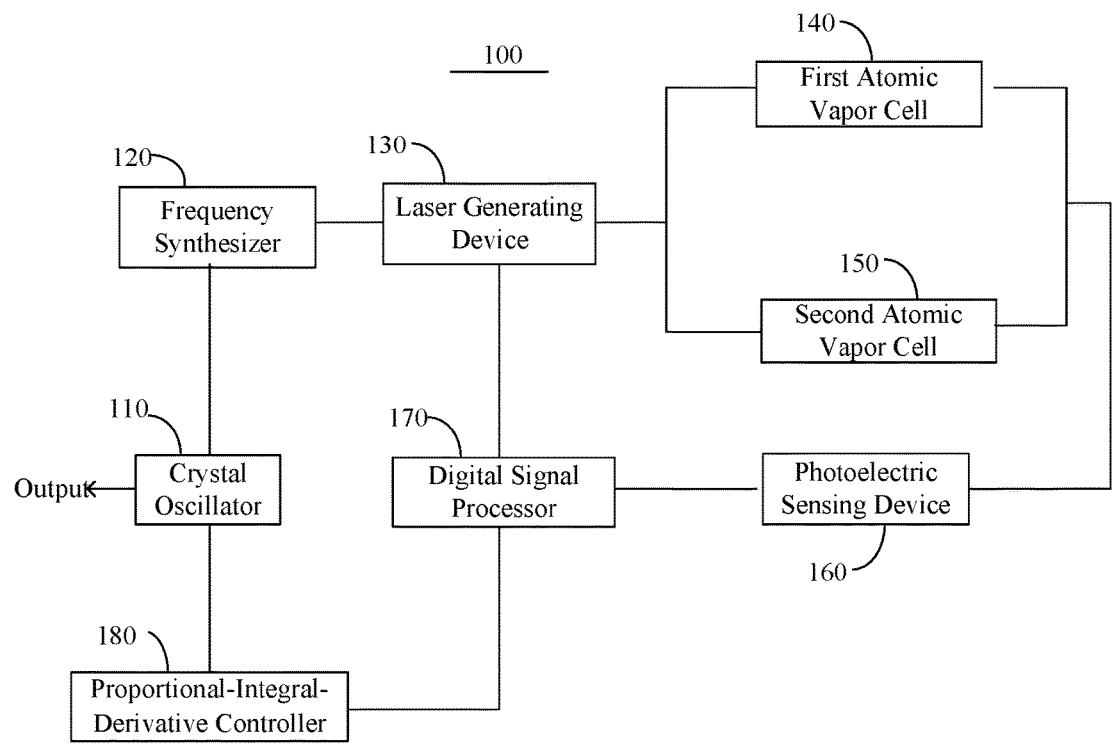
FIG. 2 is a structural block diagram of an embodiment of an alkali-metal vapor cell atomic clock system.

As shown in FIG. 2, an embodiment of the present disclosure provides an alkali-metal vapor cell atomic clock system 100 capable of reducing the Dick effect. The alkali-metal vapor cell atomic clock system 100 comprises a crystal oscillator 110, a frequency synthesizer 120 connected with the crystal oscillator 110, a laser generating device 130, a first atomic vapor cell 140, a second atomic vapor cell 150, a photoelectric sensing device 160, a digital signal processor 170, and a proportional-integral-derivative controller 180.

A frequency signal emitted by the crystal oscillator 110 is converted into a microwave signal by the frequency synthesizer 120. The frequency synthesizer 120 outputs the microwave signal into the laser generating device 130. The microwave signal modulates a laser beam emitted by the laser generating device 130. After the laser beam emitted by the laser generating device 130 is modulated by the microwave signal, the modulated laser beam is divided into a first laser signal entering the first atomic vapor cell 140 and a second laser signal entering the second atomic vapor cell 150. The first laser signal and the second laser signal have the same intensity. The first atomic vapor cell 140 and the second atomic vapor cell 150 are both alkali-metal atomic vapor cells for providing alkali-metal atomic vapor. The digital signal processor 170 is connected with the laser generating device 130. The digital signal processor 170 outputs a first time sequence to control the first laser signal. The digital signal processor 170 outputs a second time sequence to control the second laser signal. That is, the time sequence of the first laser signal and the time sequence of the second laser signal can be controlled by the digital signal processor 170. The photoelectric sensing device 160 is connected with the digital signal processor 170. The photoelectric sensing device 160 is configured to convert an optical signal output from the first atomic vapor cell 140 and another optical signal output from the second atomic vapor cell 150 into electrical signals, which are transmitted to the digital signal processor 170. According to the electrical signals, the digital signal processor 170 calculates a correction signal. The proportional-integral-derivative controller 180 is connected with the crystal oscillator 110 and the digital signal processor 170. According to the correction signal calculated by the digital signal processor 170, the proportional-integral-derivative controller 180 generates a feedback signal to adjust the output frequency signal of the crystal oscillator 110.

Specifically, the crystal oscillator 110 is a voltage-controlled oscillator, whose output frequency is controlled by the voltage input to the crystal oscillator. For example, if the input voltage increases, the output frequency will increase, and if the input voltage decreases, the output frequency will decrease. The feedback signal is a voltage signal, and therefore the output frequency of the crystal oscillator can be adjusted by the feedback signal. The working principle of the atomic clock is described as follows. The atomic electron transition spectral line is set to be a standard. The frequency of the microwave output by the frequency synthesizer according to the frequency of the crystal oscillator is compared with the frequency of the atom. If the frequency of the microwave differs from a center frequency of the atom, then the feedback voltage caused by the difference is output to the crystal oscillator by the system, and the frequency of the crystal oscillator is adjusted to be the same as the center frequency of the atom.

In the alkali-metal vapor cell atomic clock system 100, the time sequence of the first laser signal and the time sequence of the second laser signal can be controlled by the digital signal processor 170, thereby enabling the first atomic vapor cell 140 and the second atomic vapor cell 150 to lock the crystal oscillator 110 alternately. Through alternately locking the crystal oscillator 110, the dead time is reduced, thereby reducing the Dick effect. Thus, the alkali-metal vapor cell atomic clock system 100 can have a more stable output of the frequency of the crystal oscillator 110. In addition, since the cost of the crystal oscillator 110 is low, the alkali-metal vapor cell atomic clock system 100 provided by the embodiment of the present application has the advantages of low cost and high stability.

Figure 3:
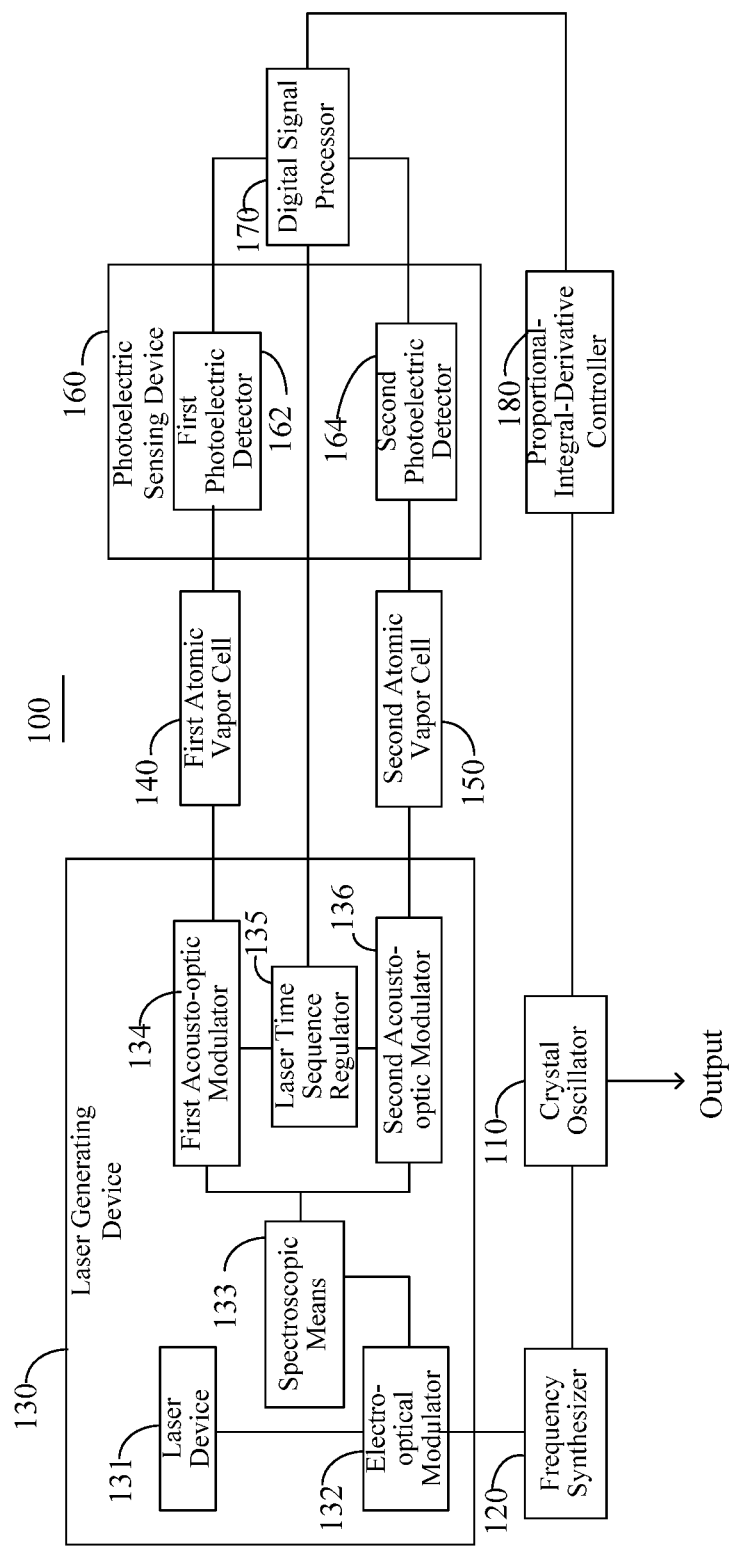
FIG. 3 is a structural block diagram of another embodiment of the alkali-metal vapor cell atomic clock system.

Referring to FIG. 3, in an embodiment, the laser generating device 130 comprises a laser device 131, an electro-optical modulator 132, a spectroscopic means 133, a first acousto-optic modulator 134, a second acousto-optic modulator 136, and a laser time sequence regulator 135.

The laser beam emitted by the laser device 131 enters the electro-optical modulator 132. The microwave signal emitted by the frequency synthesizer 120 is input into the electro-optical modulator 132. In the electro-optical modulator 132, the laser beam is modulated by the microwave signal. The modulated laser beam is divided into the first laser signal and the second laser signal by the spectroscopic means 133. The first laser signal and the second laser signal have the same intensity. The first laser signal enters the first acousto-optic modulator 134, and the second laser signal enters the second acousto-optic modulator 136. The laser time sequence regulator 135 is respectively connected with the first acousto-optic modulator 134, the second acousto-optic modulator 136, and the digital signal processor 170. The digital signal processor 170 outputs the first time sequence into the laser time sequence regulator 135, to control the time sequence of the first laser signal. The digital signal processor 170 outputs the second time sequence into the laser time sequence regulator 135, to control the time sequence of the second laser signal. The structure of the spectroscopic means 133 is not limited, so long as it can divide the laser beam emitted by the laser device 131 into two beams with the same intensity. In an embodiment, the spectroscopic means 133 is a non-polarization beam splitting prism. In addition, the laser generating device 130 can further comprise a half-wave plate disposed between the electro-optical modulator 132 and the laser device 131.

Figure 4:
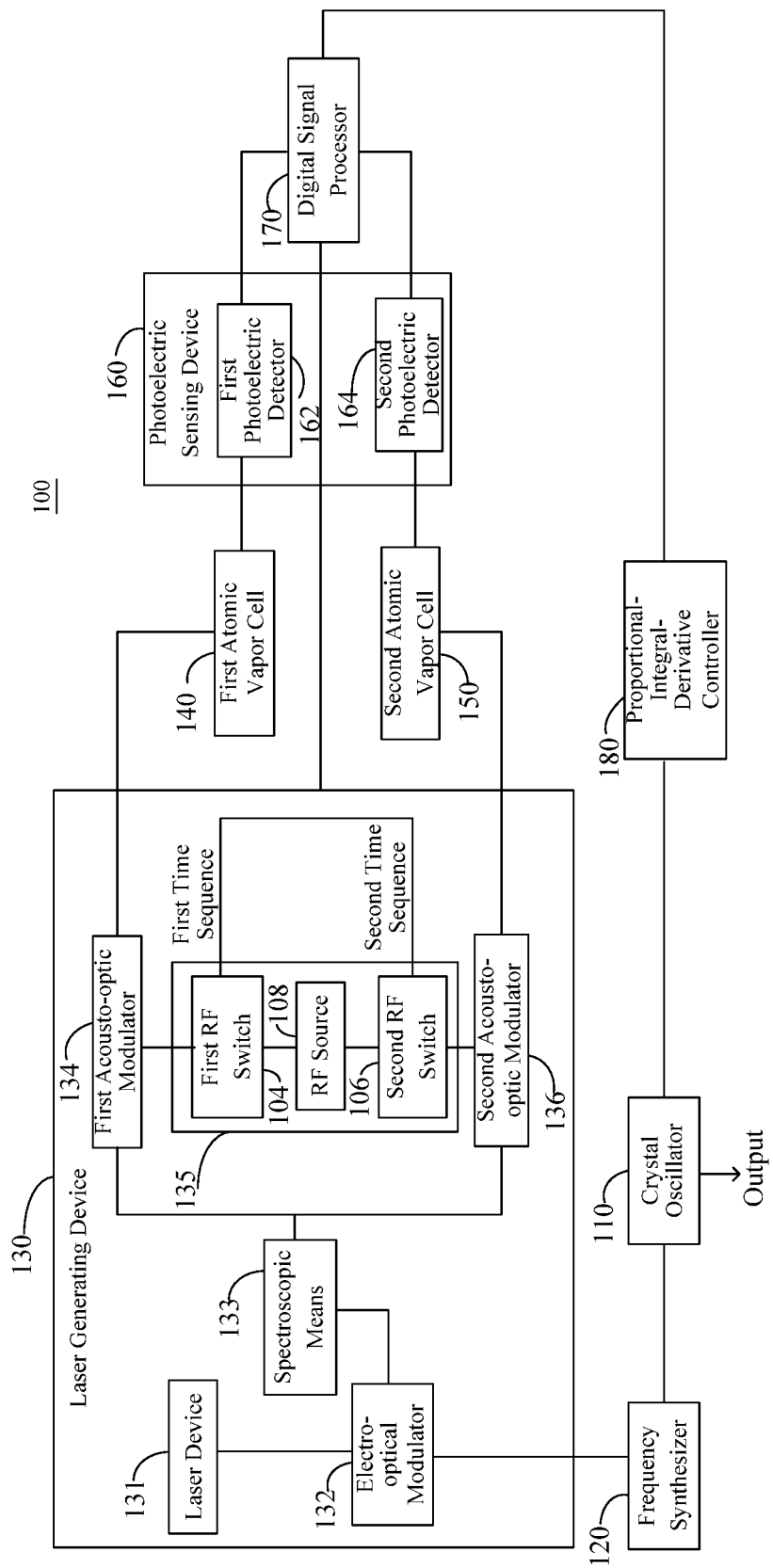
FIG. 4 is a structural block diagram of yet another embodiment of the alkali-metal vapor cell atomic clock system.

Referring to FIG. 4, in an embodiment, the laser time sequence regulator 135 comprises a first radio frequency (RF) switch 104, a second RF switch 106, and a RF source 108. The RF source 108 is connected with the first RF switch 104 and the second RF switch 106, and is configured to provide a radio frequency signal. The first RF switch 104 is connected with the first acousto-optic modulator 134 and the digital signal processor 170. The second RF switch 106 is connected with the second acousto-optic modulation 136 and the digital signal processor 170. The digital signal processor 170 outputs the first time sequence into the first RF switch 104, to control the time sequence of the first laser signal. The digital signal processor 170 outputs the second time sequence into the second RF switch 106, to control the time sequence of the second laser signal.

In an embodiment, the photoelectric sensing device 160 comprises a first photoelectric detector 162 and a second photoelectric detector 164. The digital signal processor 170 is respectively connected with the first photoelectric detector 162 and the second photoelectric detector 164. The first photoelectric detector 162 is configured to convert an optical signal output from the first atomic vapor cell 140 into an electrical signal. The second photoelectric detector 164 is configured to convert an optical signal output from the second atomic vapor cell 150 into another electrical signal.

Figure 5:
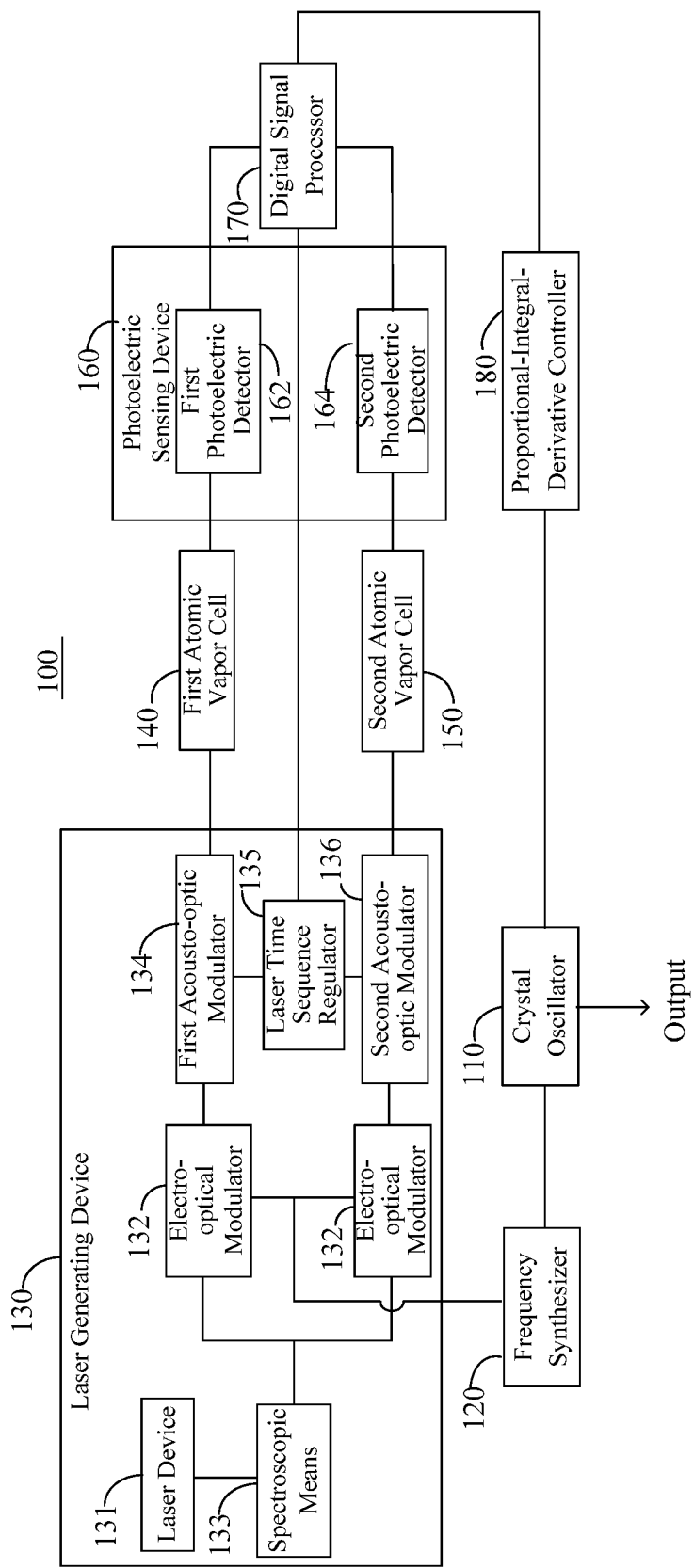
FIG. 5 is a structural block diagram of yet another embodiment of the alkali-metal vapor cell atomic clock system.

Referring to FIG. 5, in an embodiment, the laser generating device 130 comprises a laser device 131, two electro-optical modulators 132, a spectroscopic means 133, a first acousto-optic modulator 134, a second acousto-optic modulator 136, and a laser time sequence regulator 135.

Different from FIG. 4, in the embodiment of FIG. 5, the laser generating device 130 comprises two electro-optical modulators 132. The laser beam emitted by the laser device 131 is firstly divided into two laser beams with the same intensity by the spectroscopic means 133, and the two laser beams enter two electro-optical modulators 132, respectively. The microwave signals emitted by the frequency synthesizer 120 are input into two electro-optical modulators 132, respectively. In the electro-optical modulators 132, the microwave signals modulate the laser beams. The modulated two laser beams are the first laser signal and the second laser signal. The first laser signal and the second laser signal have the same intensity. The first laser signal enters the first acousto-optic modulator 134, and the second laser signal enters the second acousto-optic modulator 136. The laser time sequence regulator 135 is respectively connected with the first acousto-optic modulator 134, the second acousto-optic modulator 136, and the digital signal processor 170. The digital signal processor 170 outputs the first time sequence into the laser time sequence regulator 135, to control the time sequence of the first laser signal. The digital signal processor 170 outputs the second time sequence into the laser time sequence regulator 135, to control the time sequence of the second laser signal. The structure of the spectroscopic means 133 is not limited, so long as it can divide the laser beam emitted by the laser device 131 into two beams with the same intensity. In an embodiment, the spectroscopic means 133 is a non-polarization beam splitting prism. In addition, the laser generating device 130 can further comprise a half-wave plate disposed between the electro-optical modulator 132 and the laser device 131.

Figure 6:
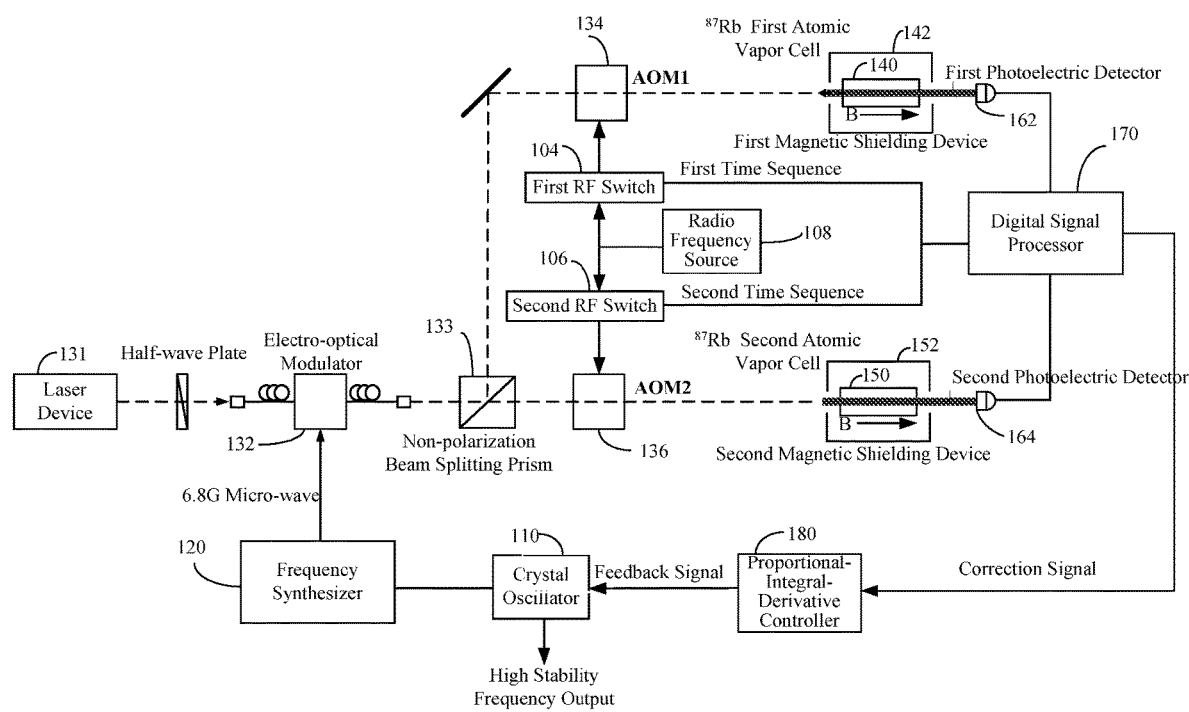
FIG. 6 is a schematic diagram illustrating an embodiment of an optical path of a working alkali-metal vapor cell atomic clock system.

Referring to FIG. 6, in an embodiment, the alkali-metal vapor cell atomic clock system 100 can further comprise a first magnetic shielding device 142 and a second magnetic shielding device 152. The first atomic vapor cell 140 is disposed in the first magnetic shielding device 142. The second atomic vapor cell 150 is disposed in the second magnetic shielding device 152. The first magnetic shielding device 142 and the second magnetic shielding device 152 are configured to provide magnetic shields. Specifically, the first magnetic shielding device 142 can provide a magnetic shield for the first atomic vapor cell 140. The second magnetic shielding device 152 can provide another magnetic shield for the second atomic vapor cell 150. Each of the magnetic shielding devices above is provided with an axial magnetic field coil (not shown) and an atomic vapor cell heater (not shown). The axial magnetic field coil is configured to provide a stable axial magnetic field for the atomic vapor cell. The atomic vapor cell heater is configured to heat the atomic vapor cell, so as to provide atomic vapor. The atoms in the atomic vapor cell can be $^{87}$Rb, $^{85}$Rb or $^{133}$Cs, and the corresponding laser device and the output frequency of the frequency synthesizer will be changed according to different atoms.

FIG. 6 is a schematic diagram illustrating the connection and the optical path of the working alkali-metal vapor cell atomic clock system 100. The working process of the alkali-metal vapor cell atomic clock system 100 will be described below taking FIG. 6 as an example. The laser beam emitted by the laser device 131 is sent to the electro-optical modulator 132 through the half-wave plate. The 10 M frequency signal generated by the crystal oscillator 110 generates a microwave signal through the frequency synthesizer 120. The microwave signal is fed to a microwave input port of the electro-optical modulator 132, so as to modulate the phase of the laser beam entering the electro-optical modulator 132. The phase-modulated laser beam is outputted from the electro-optical modulator 132, and is divided into two portions with the same intensity by a non-polarization beam splitting prism (the spectroscopic means 133), and the two portions enter into the first acousto-optic modulator 134 and the second acousto-optic modulator 136, respectively. A portion entering the first acousto-optic modulator 134 is the first laser signal, and the other portion entering the second acousto-optic modulator 136 is the second laser signal. The digital signal processor 170 outputs the first time sequence to control the time sequence of the first laser signal through the first RF switch 104. The digital signal processor 170 outputs the second time sequence to control the time sequence of the second laser signal through the second RF switch 106. The first time sequence and the second time sequence have same laser pumping time and free evolution time. In order to reduce the dead time, the free evolution time of the first time sequence overlaps at least partially the laser pumping time of the second time sequence.

Figure 7:
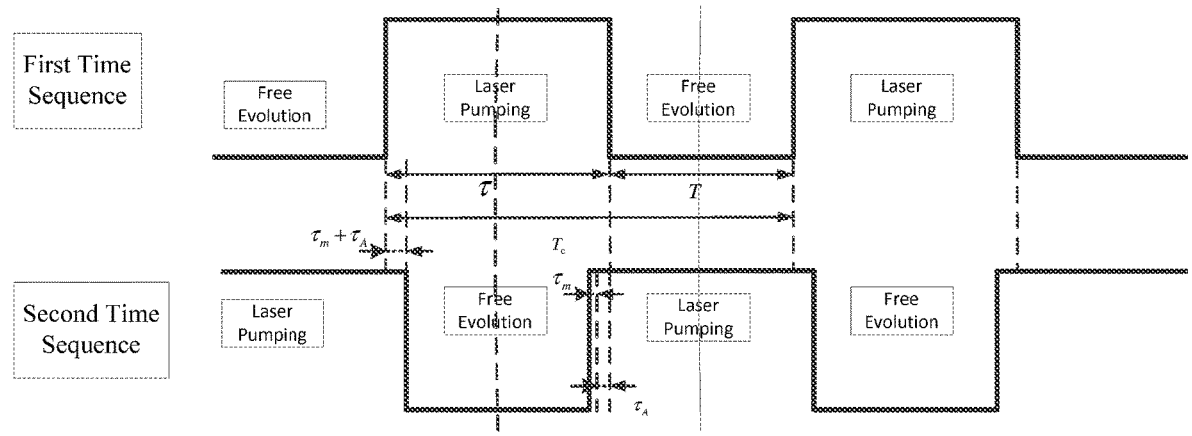
FIG. 7 is a working time sequence diagram of an embodiment of the alkali-metal vapor cell atomic clock system.

Specifically, referring to FIG. 7, the control of the first time sequence and the second time sequence are described as follows. In FIG. 7, the first atomic vapor cell 140 corresponds to the first time sequence. The second atomic vapor cell 150 corresponds to the second time sequence. As can be seen from FIG. 7, the free evolution time T of the first time sequence overlaps partially the laser pumping time of the second time sequence, and the laser pumping time of the first time sequence overlaps partially the free evolution time of the second time sequence. Since the free evolution time of the alkali-metal atomic vapor cell is the effective time, the present application can achieve an alternative locking of the crystal oscillator 110 by a cooperation of the first atomic vapor cell 140 and the second atomic vapor cell 150, and by setting the first time sequence and the second time sequence.

Specifically, at the beginning, the first laser signal entering the first atomic vapor cell 140 is closed by shutting off the first RF switch 104, so that the first atomic vapor cell 140 is in a free evolution state. At the same time, the second RF switch 106 is turned on, enabling the second laser signal to enter the second atomic vapor cell 150, so that the second atomic vapor cell 150 is in the optical pumping state. Then, after the free evolution time T, the free evolution state of the first atomic vapor cell 140 ends, and the first RF switch 104 is turned on, enabling the first laser signal to enter the first atomic vapor cell 140. At the moment $\tau_m$ when the first RF switch 104 is turned on, the first photoelectric detector 162 acquires the optical signals, and an averaging operation during time period $\tau_A$ is performed. The averaging operation means that the signals are continuously acquired in the time period $\tau_A$, and finally an average value is output.

Immediately after the averaging operation is completed, the second RF switch 106 is turned off, so that the second atomic vapor cell 150 is in a free evolution state. After a time period T, the free evolution state of the second atomic vapor cell 150 ends, and the second RF switch 106 is turned on, so that the second laser signal enters the second atomic vapor cell 150. At the moment $\tau_m$ when the second RF switch 106 is turned on, the second photoelectric detector 164 acquires the optical signals, and an averaging operation during time period $\tau_A$ is performed. The subsequent operation process can be repeated according to the previous time sequence. By such operation, the dead time caused by optical pumping in the alkali-metal vapor cell atomic clock system 100 is eliminated, thereby reducing the Dick effect greatly.

Figure 8:
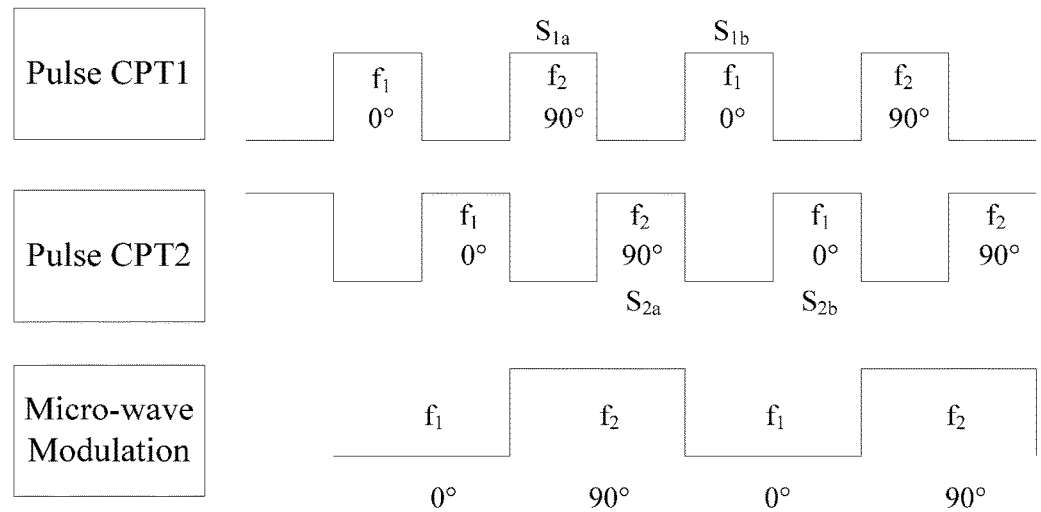
FIG. 8 is a schematic diagram illustrating an embodiment of error signal acquisition of the working alkali-metal vapor cell atomic clock system.

The optical signals are converted into the electrical signals by the first photoelectric detector 162 and the second photoelectric detector 164, and then processed by the digital signal processor 170, to obtain a correction signal. The correction signal is output to the proportional-integral-derivative controller 180, to generate a feedback signal (feedback voltage) to adjust the output frequency of the crystal oscillator 110, thereby completing a closed loop control of the alkali-metal vapor cell atomic clock system 100. In the step of generating the correction signal, the microwave signal can be modulated by square wave phase modulation or frequency modulation through the frequency synthesizer 120. The frequency or phase of the output microwave of the frequency synthesizer 120 is modulated through the modulation port of the frequency synthesizer 120. Specifically, as shown in FIG. 8, the error signal is a difference between the measured voltage signals of two phases 0° and 90° or voltage signals of two frequencies f1 and f2. The correction signal is input into the proportional-integral-derivative controller, generating a feedback voltage to adjust the output frequency of the crystal oscillator, thereby completing the closed loop control of the alkali-metal vapor cell atomic clock system 100.

In the embodiments provided in the present application, it should be understood that the related devices and methods disclosed can be implemented in other manners. For example, the device embodiments described above are merely illustrative. For example, the modules or units are classified only according to their logical functions, and can be classified in other manners in actual implementation. For example, multiple units or components can be combined or integrated into another system, or some features can be omitted or not be implemented. In addition, the mutual coupling or direct coupling or communication connection shown or discussed can be an indirect coupling or communication connection through some interfaces, devices or units and in an electrical manner, mechanical manner or other manners.

The units described as separate components can or cannot be physically separated. The components shown as units can be or cannot be physical units, that is to say, the components can be located in one place, or can be distributed in multiple network units. Some or all of the units can be selected according to actual needs to achieve the objectives of the solutions of the embodiments.

Additionally, each functional unit in the embodiment of the present invention can be integrated into one processing unit, or each unit can exist physically and separately, or two or more units can be integrated into one module. The above integrated modules can be implemented in the form of hardware or in the form of software functional units.

It is understandable to those skilled in the art that all or part of the processes in the above mentioned embodiments can be completed by the related hardware commanded by computer programs instructions, wherein the computer program can be stored in a computer readable storage medium. For example, in an embodiment of the present application, the program can be stored in a storage medium of the computer system and executed by at least one processor in the computer system, to implement the processes comprising the embodiments of the methods described above. Wherein, the storage medium can be a magnetic disk, an optical disk, a Read-Only Memory (ROM), or a Random Access Memory (RAM), etc.

What described above are preferred embodiments of the present invention, and they are described more specifically and in detail, but not intended to limit the scope of the present invention. It should be noted that, for those skilled in the art, various modifications and improvements can be made without departing from the concepts of the present invention, and they are within the protection scope of the present invention. Therefore, the scope of the invention should be determined by the appended claims.

What is claimed is:

1. An alkali-metal vapor cell atomic clock system, comprising:
    a crystal oscillator;
    a frequency synthesizer connected with the crystal oscillator;
    a proportional-integral-derivative controller connected with the crystal oscillator;
    a laser generating device, wherein a frequency signal emitted by the crystal oscillator is converted into a microwave signal by the frequency synthesizer, and the microwave signal is input into the laser generating device, to modulate a laser beam emitted by the laser generating device;
    a first atomic vapor cell and a second atomic vapor cell, wherein the laser beam emitted by the laser generating device is divided into a first laser signal entering the first atomic vapor cell and a second laser signal entering the second atomic vapor cell, and the first atomic vapor cell and the second atomic vapor cell are both alkali-metal atomic vapor cells;
    a digital signal processor connected with the laser generating device and the proportional-integral-derivative controller respectively, wherein the digital signal processor outputs a first time sequence to control the first laser signal, and the digital signal processor outputs a second time sequence to control the second laser signal; and
    a photoelectric sensing device connected with the digital signal processor, wherein the photoelectric sensing device is configured to receive optical signals respectively output from the first atomic vapor cell and the second atomic vapor cell, convert the optical signals into electrical signals, and transmit the electrical signals to the digital signal processor, the digital signal processor calculates a correction signal according to the electrical signals; the proportional-integral-derivative controller adjusts an output frequency signal of the crystal oscillator according to the correction signal.

2. The alkali-metal vapor cell atomic clock system according to claim 1, wherein the laser generating device comprises a laser device, an electro-optical modulator, a spectroscopic means, a first acousto-optic modulator, a second acousto-optic modulator, and a laser time sequence regulator; the microwave signal and the laser beam emitted by the laser device enter the electro-optical modulator, in which the laser beam is modulated by the microwave signal; a modulated laser beam is divided, by the spectroscopic means, into the first laser signal and the second laser signal having the same intensity; and the laser time sequence regulator is connected with the digital signal processor.

3. The alkali-metal vapor cell atomic clock system according to claim 2, wherein the spectroscopic means is a non-polarization beam splitting prism.

4. The alkali-metal vapor cell atomic clock system according to claim 2, wherein the laser generating device further comprises a half-wave plate disposed between the electro-optical modulator and the laser device.

5. The alkali-metal vapor cell atomic clock system according to claim 2, wherein the laser time sequence regulator comprises a first radio frequency (RF) switch connected with the first acousto-optic modulator, a second RF switch connected with the second acousto-optic modulator, and a RF source which is connected with the first RF switch and the second RF switch; and the first RF switch and the second RF switch are connected with the digital signal processor.

6. The alkali-metal vapor cell atomic clock system according to claim 1, wherein the photoelectric sensing device comprises a first photoelectric detector and a second photoelectric detector respectively connected with the digital signal processor; the first photoelectric detector is configured to convert the optical signal output from the first atomic vapor cell into an electrical signal; and the second photoelectric detector is configured to convert the optical signal output from the second atomic vapor cell into another electrical signal.

7. The alkali-metal vapor cell atomic clock system according to claim 1, further comprising a first magnetic shielding device and a second magnetic shielding device; wherein a first magnetic field coil and a first atomic vapor cell heater are provided inside the first magnetic shielding device; a second magnetic field coil and a second atomic vapor cell heater are provided inside the second magnetic shielding device; the first magnetic shielding device is configured to provide a magnetic shield for the first atomic vapor cell; the second magnetic shielding device is configured to provide another magnetic shield for the second atomic vapor cell.

8. The alkali-metal vapor cell atomic clock system according to claim 1, wherein the crystal oscillator is a voltage-controlled oscillator.

9. The alkali-metal vapor cell atomic clock system according to claim 1, wherein a free evolution time of the first time sequence overlaps at least partially a laser pumping time of the second time sequence.

10. The alkali-metal vapor cell atomic clock system according to claim 9, wherein the first atomic vapor cell and the second atomic vapor cell alternately lock the crystal oscillator; when the first atomic vapor cell is in a free evolution state, the second atomic vapor cell is in a laser pumping state.

11. The alkali-metal vapor cell atomic clock system according to claim 1, wherein the laser generating device comprises a laser device, two electro-optical modulators, a spectroscopic means, a first acousto-optic modulator, a second acousto-optic modulator, and a laser time sequence regulator; a laser beam emitted by the laser device is divided into two laser beams with the same intensity by the spectroscopic means, and the two laser beams enter the two electro-optical modulators respectively; microwave signals emitted by the frequency synthesizer are input into two electro-optical modulators respectively; in the electro-optical modulators, the microwave signals modulate the laser beams; modulated two laser beams are a first laser signal and a second laser signal; the first laser signal and the second laser signal have the same intensity; and the laser time sequence regulator is connected with the first acousto-optic modulator, the second acousto-optic modulator, and the digital signal processor respectively.

12. The alkali-metal vapor cell atomic clock system according to claim 5, wherein the digital signal processor outputs the first time sequence into the first RF switch, to control a time sequence of the first laser signal; the digital signal processor outputs the second time sequence into the second RF switch, to control a time sequence of the second laser signal.

13. The alkali-metal vapor cell atomic clock system according to claim 9, wherein a laser pumping time of the first time sequence overlaps partially a free evolution time of the second time sequence.

* * * * *